United States Patent [19]

Ishioka et al.

[11] Patent Number: 4,829,345
[45] Date of Patent: May 9, 1989

[54] ELECTRONIC DEVICE HAVING LIGHT TRANSMISSION SYSTEM

[75] Inventors: Sachio Ishioka, Toshima; Kazutaka Tsuji, Hachioji; Yukio Takasaki, Kawasaki; Yasuharu Shimomoto; Hirokazu Matsubara, both of Nishitama; Tadaaki Hirai, Koganei, all of Japan

[73] Assignee: Hitachi, Ltd., Tokyo, Japan

[21] Appl. No.: 857,089

[22] Filed: Apr. 29, 1986

[30] Foreign Application Priority Data

May 7, 1985 [JP] Japan .................................. 60-95445

[51] Int. Cl.⁴ ..................... H01L 31/16; H01L 29/06; H01S 3/19
[52] U.S. Cl. .......................... 357/19; 357/4; 357/16; 357/30; 372/50
[58] Field of Search ............... 357/4 SL, 16, 19, 30 E; 372/45, 50

[56] References Cited

U.S. PATENT DOCUMENTS

| | | | |
|---|---|---|---|
| 4,054,363 | 10/1977 | Suematsu | 372/50 |
| 4,136,928 | 1/1979 | Logan et al. | 372/50 |
| 4,323,911 | 4/1982 | Campbell et al. | 357/30 E |
| 4,546,480 | 10/1985 | Burnham et al. | 372/45 |
| 4,603,421 | 7/1986 | Scifres | 372/50 |
| 4,605,942 | 8/1986 | Camlibel et al. | 372/50 |
| 4,614,958 | 9/1986 | Mikami | 357/19 |
| 4,620,214 | 10/1986 | Margaht et al. | 357/16 |
| 4,674,100 | 6/1987 | Kobayashi | 372/50 |

FOREIGN PATENT DOCUMENTS

| | | | |
|---|---|---|---|
| 60-788 | 1/1985 | Japan | 372/50 |
| 2113912 | 8/1983 | United Kingdom | 357/19 |

*Primary Examiner*—Andrew J. James
*Assistant Examiner*—Jerome Jackson
*Attorney, Agent, or Firm*—Antonelli, Terry & Wands

[57] ABSTRACT

Within an electronic device having a plurality of circuit parts (such as a three-dimensional device), a light transmission system which transfers signals between the circuit parts by the use of light is provided.

The light transmission system is formed of a light emitting source which emits light having a desired wavelength, a photoelectric conversion portion which absorbs the light and converts it into an electric signal, and a light traveling path which conveys the light emitted from the light emitting source to the photoelectric conversion portion.

Further, each of the light emitting source, the light traveling path and the photoelectric conversion portion is formed of a superlattice structure in which a plurality of materials of unequal energy gaps are layered.

8 Claims, 2 Drawing Sheets

ELECTRONIC DEVICE HAVING LIGHT TRANSMISSION SYSTEM

BACKGROUND OF THE INVENTION

The present invention relates to a method of optical signal transportation within an integrated circuit (IC), an electronic device, etc. More particularly, it provides a light transmission system for an electronic device in which a signal is transmitted to a desired layer even when layers having different functions are accumulated and integrated as in a three-dimensional integrated circuit.

In the operation of an electronic device, internal information signals have important roles. Especially in the electronic device of a structure wherein parts of different functions are connected and integrated in parallel or in layers, the mutual transfer of information is indispensable. To this end, a method of electrically connecting both the parts is adopted most commonly. This is described in 'Japan Journal of Applied Physics', Vol. 20, No. 9 (1981), pp. L623–L626.

However, in such a case where the functional parts are arranged separately with an insulator therebetween or where they form a multilayer structure vertically, an electrical interconnection has been impossible or a complicated process has been required.

SUMMARY OF THE INVENTION

An object of the present invention is to provide a light transmission path for smoothly effecting the transfer of signals between electronic devices or functional parts constructed as described above.

In order to accomplish this object, the present invention disposes a light transmission system within an electronic device having a plurality of circuits.

The light transmission system is formed of a light emitting source which emits light having a desired wavelength, a photoelectric conversion part which absorbs the light and converts it into an electric signal, and a light traveling path which conveys the light emitted from the light emitting source, to the photoelectric conversion part.

Further, each of the light emitting source, the light traveling path and the photoelectric conversion part is formed of a superlattice structure in which a plurality of materials of unequal energy gaps are accumulated.

Now, the superlattice structure will be described.

In general, the transmittance of materials are inherent in the respective materials, and in case of mixing two sorts of materials, a transmittance peculiar to the mixture is uniquely determined. In recent years, however, it has been revealed that when semiconductors of unequal transmittance or energy gaps are regularly placed one over another as very thin layers, an energy gap unequal to those of both the semiconductors can be formed.

FIG. 1 is a diagram for explaining such a phenomenon. In the figure, B indicates a material which is greater in the energy gap than a material A, and the combination of the materials consists of GaAs as A and GaAlAs as B by way of example. When the thickness of each layer of such a layered structure decreases down to the order of 100 Å, the quantum effect appears, and new energy levels are formed in the part A of narrow energy as shown in FIG. 1. In the figure, numeral 1 designates the conduction band of the material A, numeral 2 the conduction band of the material B, numeral 3 the valence band of the material A, and numeral 4 the valence band of the material B. Numerals 5 and 6 indicate the conduction band and valence band of the levels formed anew, respectively. The positions of the new levels are expressed as:

$$E_n = (h^2 n^2)/(8 m L^2) \qquad (1)$$

Here, L denotes the thickness of the layer A, h Planck's constant, and m the effective mass of a carrier. n indicates the ordering number of levels, and a case of n=1 is illustrated in FIG. 1. With an increase in n, the energy level shifts to a higher energy side. When the value of an electron is selected as m, the position corresponds to the conduction band side, and when the value of a hole is selected, the position corresponds to the valence band side.

Under such circumstances, the optical properties. of this system are chiefly predominantly by a new energy gap $E_c$ defined by the conduction band 5 and the valence band 6. By way of example, the wavelengths of emission based on carrier injection becomes a value corresponding to $E_c$, and also the absorbance is the greatest for the wavelength corresponding to $E_c$. It is accordingly possible, for example, to change the optical protection by changing an energy confinement width L, as described in 'Japan Journal of Applied Physics', Vol. 20, No. 9, 1981, pp. L623–L626. The above is the explanation of the superlattice structure.

The inventors have devised a light transmission system which can guide light selectively by skillfully utilizing the phenomenon and which is able to be installed in an electronic device such as an integrated circuit.

DESCRIPTION OF PREFERRED EMBODIMENTS

Figure 2:
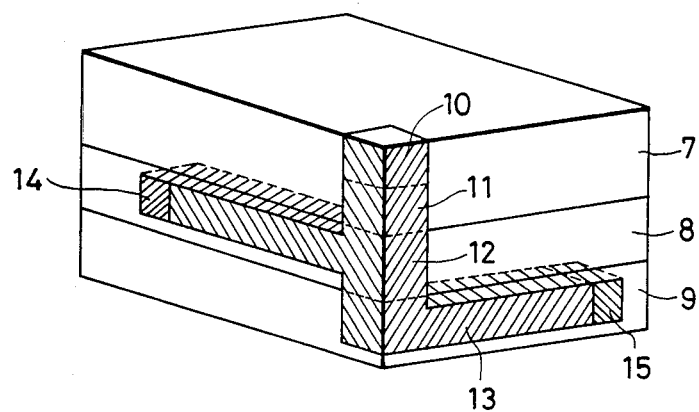
FIG. 2 is a general view of an electronic device in which the light transmission system of the present invention is built.
Figure 3:
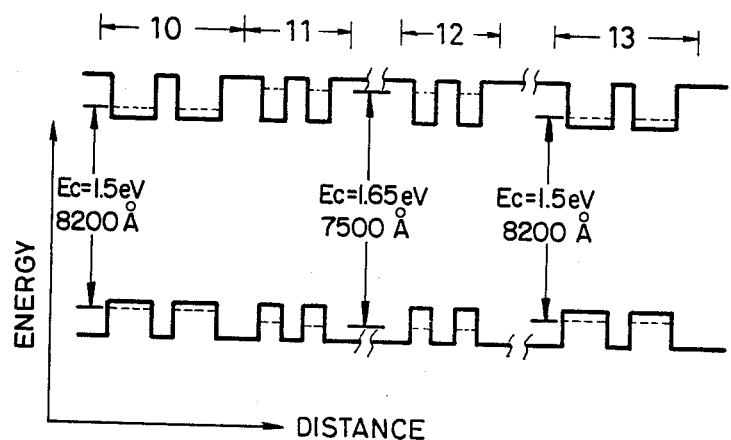
FIG. 3 is a diagram for explaining the energy bands of the light transmission system of the present invention.

Now, an embodiment of the present invention will be described. FIG. 2 shows an electronic device which consists of circuits 7, 8 and 9 having three sorts of different functions, for example, a sensing part, a data processing part and a memory part. In the figure, portions 10 thru 15 constitute the light transmission system of the present invention, in which the portions 10 and 11 are optical signal generation portions, those 12 and 13 are light conveyance portions, and those 14 and 15 are photoelectric detection portions. FIG. 3 is an energy band diagram of this light transmission system.

Figure 1:
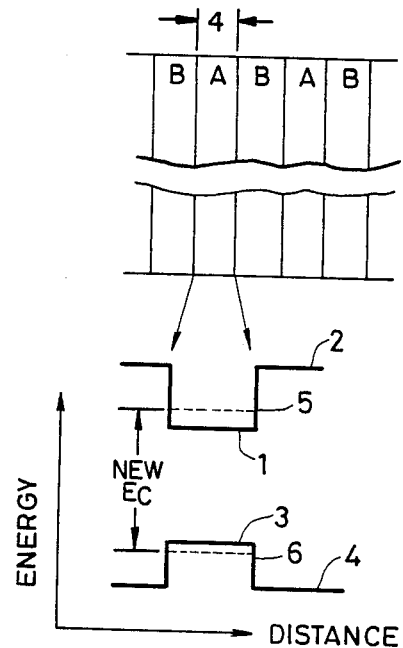
FIG. 1 is a sectional view of a structure in which materials A and B of unequal energy gaps are layered, as well as a diagram for explaining energy bands in the structure.

As shown in FIG. 3, the optical signal generation portions 10 and 11 belonging to the circuit 7 are of layered structures each of which is made of materials of unequal energy gaps. The material of narrower gap corresponding to the material A in FIG. 1 is thicker in the portion 10 than in the portion 11. Consequently, as understood from Eq. (1), an energy gap which is formed in the region 10 becomes narrower than in the region 11, and the emission wavelengths of the region 10 is long, while that of the region 11 is short.

Meanwhile, the light traveling paths 12 and 13 are formed of layered structures each of which is similarly made of different materials. The thicknesses of layers are selected so that the path 12 may have a wider energy gap than the path 13.

As a concrete example, GaAs (energy gap: 1.43 eV) is chosen as the material A and AlAs (energy gap: 2.16 eV) as the material B, and the layered structures are formed by molecular beam epitaxy or MOCVD (CVD based on the plasma decomposition of organic metals). The width of the GaAs layer is set to 100 Å in each of the regions 10 and 13, and to 35 Å in each of the regions 11 and 12. The width of the AlAs (material B) is set to 100 Å in any of the regions. At this time, the effective energy gap becomes approximately 1.5 eV in each of the regions 10 and 13 and 1.65 eV in each of the regions 11 and 12.

Now, when carriers are injected into the region 10 in the circuit 7, light is emitted at a wavelength of about 8200 Å. This light is transmitted through the regions 11 and 12, and is absorbed by the region 13 to generate photocarriers. The photocarriers are derived as an electric signal through the region 15. On the other hand, when carriers are injected into the region 11, light is emitted at a wavelength of about 7500 Å, and this light is absorbed by the region 12. In the case of this wavelength, the light is absorbed also by the region 13. However, photocarriers can be prevented from flowing into the region 13 by such a method as increasing the number of wells in the region 12 or setting a low threshold level of detection for the region 13.

In this way, when the optical signal generator 10 is driven, the signal is sent to the circuit 9, and when the optical signal generator 11 is driven, a signal is sent to the circuit 8. By flashing the optical signal generators, digital signals can also be transmitted.

Although the present embodiment has illustrated the method in which both the light emission portions and the light conveyance portions are formed of the same combination of the materials, a similar effect is attained even when different materials are used for the individual light emission portions or when light emitting diodes or the like are employed. In addition, although the signals are transmitted in one direction in the example, signals can be emitted from the second layer 8 to both the first layer 7 and the third layer 9. The characterizing feature of the present invention consists in that a multilayer structure is formed wherein the width of a well layer broadens gradually with an increase in distance from a light emitting portion which generates a signal, thereby to endow the absorbance with a wavelength dependency. It is also possible that, when one set of materials can no longer meet a requirement, a light conveyance path is formed from an intermediate position by the use of a different combination. Of course, the number of circuits is not restricted to three, the circuits may well be arranged laterally, and a light transmitting insulator film may well be interposed between the circuits.

Although, in the present embodiment, the effect has been explained as to compound semiconductor materials, other kinds of materials may be selected according to the purpose of an electric device.

As described above, according to the present invention, signals can be transmitted to desired places within an electronic device, so that information can be transferred very smoothly between different circuit components in the electronic device in which the circuit having different functions are combined.

What is claimed is:

1. An electronic device having a light signal transmission system, comprising:
    a plurality of circuit parts;
    a light emitting source which emits a plurality of light signals having unequal wavelengths from one another and which is provided in at least one of said circuit parts;
    at least one photoelectric detection portion which is provided in at least one of said circuit parts in order to detect that a predetermined one of said plurality of light signals has been emitted by said light emitting source; and
    a light traveling path which has both its edges connected to said light emitting source and said photoelectric detection portion, respectively, and which is provided in at least one said circuit parts,
    and which is formed of superlattice structure in which a plurality of materials of individual thicknesses and of unequal energy gaps are layered in such a way that the thicknesses of narrow energy gap layers is broadened with an increase of the distance from said light emitting source.

2. An electronic device having a light signal transmission system as defined in claim 1, wherein the materials are GaAs and AlAs.

3. An electronic device having a light signal transmission system, comprising:
    a plurality of circuit parts;
    a first light emitting source of layered materials for emitting light signals of a first wavelength being provided in one of said circuit parts;
    a second light emitting source of layered materials for emitting light signals of a second wavelength being provided in one of said circuit parts;
    a first light signal detecting portion responsive to light signals from said first emitting source provided in one of said circuit parts;
    a second light signal detecting portion responsive to light signals from said second source provided in one of said circuit parts;
    light signal path means provided between said first and second emitting sources and said first and second detecting portions for guiding and switching the respective light signals therebetween; and
    each of said light emitting sources and said light signal path means being formed of superlattice structure in which a plurality of materials of unequal energy gaps are layered in the form of well layers in such a way that the width of a particular well layer is greater as the distance from a light source increases so that absorbance of light signals in the electronic device is provided based on a wavelength dependency.

4. An electronic device having a light signal transmission system as defined in claim 3, wherein the light signal path means includes a layered light signal transmission portion in a circuit part other than the circuit part having the respective light emitting sources.

5. An electronic device having a light signal transmission system as defined in claim 4, wherein the light signal path means includes a second layered light signal tranmission portion in a circuit part other than the circuit part having the respective light emitting sources.

6. An electronic device having a light signal transmission system as defined in claim 5, wherein the respective layered light signal transmission portions are in respectively different circuit parts.

7. An electronic device having a light signal transmission system as defined in claim 3, wherein said circuit parts comprise three in number which are stacked upon each other;

said first and second light emitting sources being provided in a first circuit part;

said first light signal detecting portion being provided in a second circuit part;

said second light signal detecting portion being provided in the third circuit part; and said light signal path means having portions in both the second and third circuit parts.

8. An electronic device having a light signal transmission system as defined in claim 7, wherein the materials are GaAs and AlAs.

* * * * *